CLAUDE CLAVERIE,
INVENTOR

BY Stephen H. Frishauf, atty

United States Patent Office 3,417,347
Patented Dec. 17, 1968

3,417,347
BLOCKING OSCILLATOR CIRCUIT AND SWEEP SYSTEM USING THE SAME

Claude Claverie, Asnieres, France, assignor to Compagnie Francaise Thomson Houston-Hotchkiss Brandt, Paris, France, a corporation of France Filed Aug. 15, 1967, Ser. No. 660,821
Claims priority, application France, Aug. 23, 1966, 73,834
13 Claims. (Cl. 331—112)

ABSTRACT OF THE DISCLOSURE

The blocking oscillator includes a transistor (T4) having a transformer-coupled collector-to-base feedback loop and a chargeable capacitor (C6) which discharges through selectively switchable resistance (R7, R8) during a relaxation phase and charges through resistance (R5) from the transistor base during a regeneration phase. An auxiliary circuit branch including a diode (D11) and series resistance (R12, R13) having a junction (21) biased through capacitance (C17) from the collector serves to derive a strong constant current from said base during the regeneration phase, rendering the timing of the oscillator output signal immune to variations in transistor characteristics. The emitter is biased through resistance (R15) and a decoupling capacitor (C16) whereby the output current applied to a sweep transistor (T23) during said relaxation phase of the first transistor can be rendered independent of said output timing.

Figure 1:
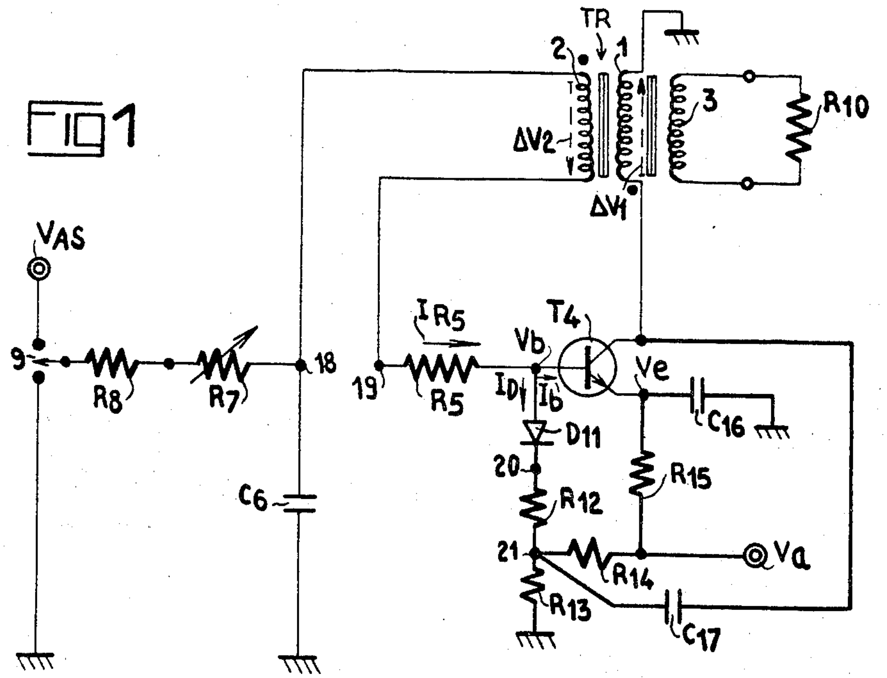

This invention relates to transistorized blocking oscillator circuits and to television sweep systems incorporating such circuits. A well-known type of blocking oscillator circuit includes a transistor having its control electrode, e.g. base, coupled to the output electrode, e.g. collector, by means of inductive coupling to provide a feedback loop for sustaining the oscillations. A chargeable capacitor is connected through charging resistance with the control electrode of the transistor and is further connected to a resistive discharge path. In operation, such a circuit will alternate between a so-called relaxation phase or period in which the transistor is cut off or blocked and the capacitor discharges, and a so-called regeneration phase of period in which the transistor is in a saturated conductive state and the capacitor is charged thereby through the charging resistance.

One important application of such blocking oscillators, to which this invention is particularly directed, is in the production of sweep voltages in a television sweep system. In such case, the output signal from the blocking oscillator, derived through a further inductive coupling from the output electrode of the aforementioned ("switching") transistor, is applied to the control electrode, e.g. base, of another ("sweep") transistor, usually by way of one or more separator and/or amplifier stages. The sweep transistor is e.g. blocked during the saturation or regeneration period of the switching transistor and is saturated during the blocking or relaxation period of the switching transistor, and thus generates the requisite sweep voltage in a beam deflecting element, such as a coil, connected to the output electrode of the sweep transistor.

Circuits of the kinds described above, though widely used, have serious practical disadvantages. It is generally important that the relaxation and regeneration periods of a blocking oscillator circuit, and hence the timing characteristics of the output signal thereof, should be precisely determined and stable. However, in circuits of the class described said timing characteristics are closely interrelated with the characteristic gain of the transistor used, and this in turn depends on the parameters of the transistor, which are difficult to predetermine accurately and uniformly in a large production series, and further are variable with external conditions, particularly temperature, and with time. Further, the currents flowing through the feedback loop and other branches of the oscillator circuit are ill-defined and the transformer coupling thus tends to operate under near short-circuit conditions. The average transistor base current is high and non-uniform, further impairing frequency control.

The above defects are especially marked in cases where the control electrode of the transistor is the base, and the feedback coupling extends from the collector or emitter to the base. This is unfortunate, because this particular feedback pattern would otherwise offer important advantages over the alternative patterns (such as collector-to-emitter feedback) in that it requires less feedback power and would thus tend to improve the oscillation sustaining conditions.

It will be understood that the inductive coupling referred to is necessary in order to ensure the correct phase relationship between the output and input of the oscillator circuit, in the fed-back signal. However, this has resulted in a further difficulty: oscillator operation tends to depend on the values of the transformer inductance, which in turn is variable with the output load impedance.

In the sweep circuit referred to above, it would be very desirable to maintain a uniform current on the control electrode of the sweep transistor during the saturated condition thereof, regardless of the timing characteristics of the circuit, as in applying the circuit with different TV line standards. It has not been readily possible to achieve this result in the prior art.

The improved blocking oscillator and sweep circuits of the invention substantially eliminate the above-mentioned difficulties. The output time characteristics are stable, largely independent of the precise parameters of the transistors used, and easily controlled, while permitting the feedback coupling to be effected from the collector (or emitter) to the base of the switching transistor, with the advantages entailed by this feedback pattern. Operation can be made substantially independent of loading. In the improved TV sweep circuit, intermediate separator stages between the switching and sweep transistors can be entirely dispensed with, greatly simplifying design and construction. Substantially uniform base current can be applied to the sweep transistor for widely different sweep timing characteristics, so that satisfactory switching between different time values, as for different television line standards, becomes feasible. Stable, well-defined currents flow through all of the circuit branches, including especially the oscillator feedback loop, further improving operation stability.

In order to accomplish these objectives, in one aspect of the invention there is provided an auxiliary circuit branch including a unidirectional conductor, e.g. diode, connected to the control electrode of the switching transistor for deriving a substantially constant current throughout the regeneration phase which current is substantially higher than the base current required to hold the switching transistor saturated; further, a coupling capacitor connects a point of said auxiliary branch with the output electrode of the switching transistor for biassing the unidirectional conductor to conduct during said regeneration phase only.

As will be explained in detail, this arrangement, while somewhat reducing the apparent gain of the switching transistor (which is practically of no consequence), at the same time renders the output characteristics of the oscillator virtually independent of the said gain and hence the parameters of the transistor used.

In a preferred embodiment, the third electrode, e.g. emitter, of the switching transistor is connected to a biassing voltage source and a decoupling capacitor. This, as will be shown, makes it possible to render the output current applied to the sweep transistor during its saturation period substantially independent of the oscillator output timing. Other features and advantages will appear.

FIG. 1 is a circuit schematic of the improved blocking oscillator.

Figure 2:
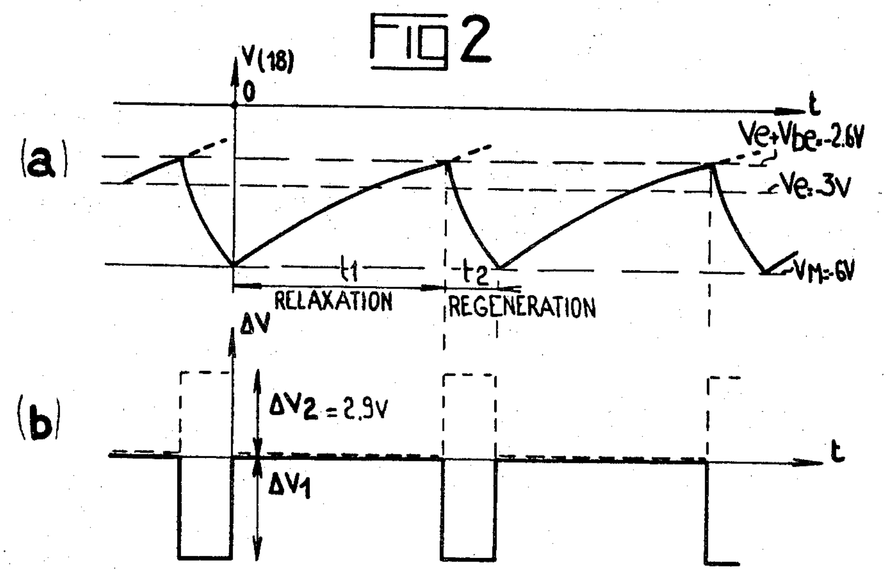

FIGS. 2(*a*) and 2(*b*) illustrate voltage waveforms appearing in the circuit of FIG. 1.

Figure 3:
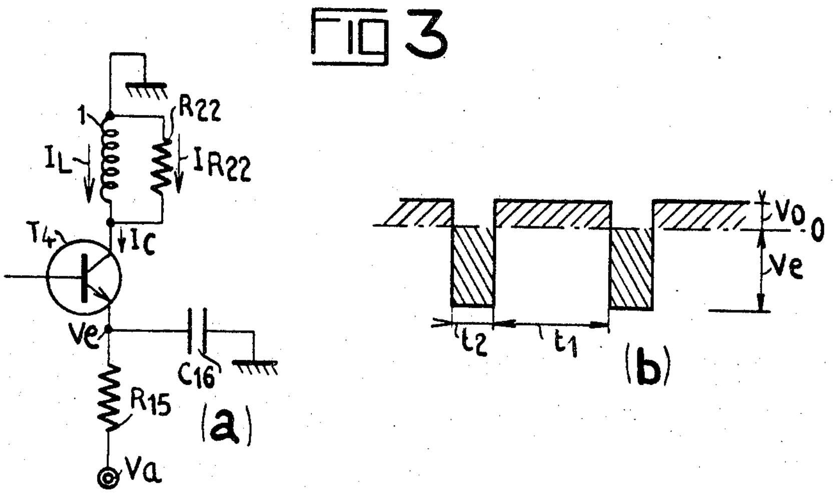
Figure 4:
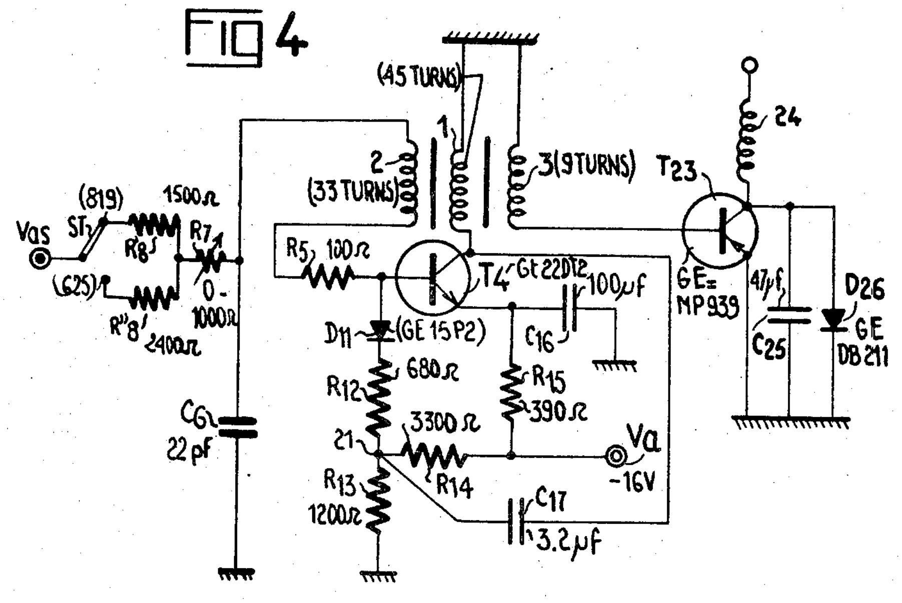

FIG. 3(*a*) shows an equivalent circuit diagram of the output part of the oscillator circuit of FIG. 1. and FIG. 3(*b*) is a graph explaining the relationship between output voltages during the respective oscillation periods; and FIG. 4 shows a television line sweep circuit embodying the blocking oscillator of FIG. 1 and other features of the invention.

The improved blocking oscillator shown in FIG. 1 includes a transistor T4, herein of the NPN type, and a three-winding transformer TR whose windings 1 and 2 serve to provide a feedback loop from the collector to the base of the transistor. A primary winding 1 of the transformer is shown with one end connected to the collector of transistor T4 and its other end grounded, and a secondary winding 2 has one end connected through a resistor R5 to the base of the transistor and has its opposite end connected to one side of a chargeable capacitor C6 having its opposite side grounded. The common junction 18 between the transformer winding 2 and capacitor C6 is further connected by way of the pair of resistors R7 and R8 in series, of which R7 is adjustable, to a switch-arm 9 which in one position is connectable to ground and in a reverse position is connected to a control voltage terminal $V_{AS}$. As indicated by the dots on the transformer TR, the windings 1 and 2 are wound in opposite senses. Transformer TR includes another secondary winding 3 which serves to derive the output signal from the oscillator system and is shown connected across a load resistor R10.

According to a feature of the invention, the base of the transistor T4 is connected to ground by way of a path including in series a diode D11 and a pair of resistors R12 and R13. The junction 21 of resistors R12 and R13 is connected to the collector of transistor T4 by way of a capacitor C17.

A supply voltage, negative in this example, is applied to a terminal $V_a$ connected through a resistor R14 to the junction 21, and through a resistor R15 to the emitter of T4. The said emitter is further connected through a decoupling capacitor C16 to ground.

The oscillator circuit thus described is generally conventional except for the circuit branch connecting the transistor base to ground by way of the diode D11 and series resistors R12–R13, the circuit branch connecting the collector to junction 21 through capacitor C17, and the circuit branch including resistor R15 and capacitor C16.

In the operation of the circuit, it will be assumed that the switch 9 is displaced to its lower position in which the switch-arm is grounded; it may already be indicated at this time that when the switch 9 is moved to its upper position so as to apply a control voltage $V_{AS}$ through the switch arm to resistor R8, the operation of the system is not modified except in that the time parameters of the output signal are altered, as will appear later.

As in a conventional blocking oscillator system of the general type to which the invention relates, the operating cycle of the system includes two consecutive phases or periods, a relaxation phase in which transistor T4 is blocked or cut off, and a regeneration phase in which the transistor is in a saturated conductive state. During the regeneration phase of each cycle, the capacitor C6 becomes charged to a prescribed negative voltage ($V_M$) through resistor R5 as later described. During the ensuing relaxation period of the cycle, this charging path is cut off because of the non-conducting condition of transistor T4, and the capacitor C6 discharges through resistors R7–R8 to ground.

The over-all type of operation just described is not affected by the presence of the circuit branch from the base of transistor T4 through diode D11 and resistors R12 and R13 to ground, because the diode remains non-conductive throughout the relaxation period, this being achieved through a suitable choice of the resistance values of R13, R14 and R12. Since the diode D11 is non-conductive during the relaxation phase, capacitor C6 cannot discharge by way of winding 2, resistor R5, diode D11 and resistors R12 and R13, but is obliged to discharge through resistors R7 and R8 as indicated above.

The variations of the voltage $V_{18}$ at capacitor terminal 18 with time are indicated in the upper graph (*a*) of FIG. 2. In the graph, the relaxation phase of the circuit is indicated as the time period $t_1$, and the regeneration phase, to be presently described, as the time period $t_2$. As shown, the capacitor voltage $V_{18}$ equals a maximum negative value $V_M$ (e.g. 6 volts) at the start of the relaxation period, and then decays exponentially according to the well-known law of capacitor discharge, the discharge being through resistors R7–R8 as earlier indicated. Since transistor T4 is non-conductive, the transistor base voltage $V_b$ remains substantially equal to $V_{18}$ during this relaxation phase and follows substantially the same exponential curve of variation as that shown for $V_{18}$.

At a certain instant, which represents the termination of the $t_1$ period, the decay of capacitor voltage $V_{18}$ has proceeded so far that the transistor base voltage $V_b$ has dropped in absolute value to less than the cutoff voltage value of the transistor, at which time the transistor becomes conductive and the regeneration phase of the system sets in. Specifically, this occurs when the base voltage $V_b$ (or the capacitor voltage $V_{18}$ which is substantially the same) becomes more positive than the sum of voltages $V_e+V_{be}$ where $V_e$ represents the emitter bias voltage as determined by the supply voltage $V_a$ and resistance R15, and $V_{be}$ is the base-emitter voltage, a characteristic of the transistor. By way of example, and as approximately indicated in the graph FIG. 2(*a*), $V_e$ may be about −3 volts, and $V_{be}$ may be about 0.4 v. The time duration $t_1$ of the relaxation period can be calculated from the known circuit constants, and the calculation will be set out later.

At the instant transistor T4 becomes conductive, a negative current pulse is transmitted from supply terminal $V_a$ through resistor R15 and the conductive transistor and transformer winding 1 to ground. The voltage at the collector terminal of the transistor, which was substantially at ground potential throughout the relaxation phase, drops sharply by a negative amount $\Delta V_1$. The negative voltage pulse $\Delta V_1$ thus appearing across transformer primary 1 induces a positive voltage pulse $\Delta V_2$ across the secondary 2, the induced pulse being positive because of the reverse senses in which the transformer windings are wound as earlier indicated. Specifically, if $n_1$ and $n_2$ designate the numbers of turns in windings 1 and 2, then $\Delta V_2=(-n_2/n_1)\Delta V_1$. The opposite-polarity voltage pulses $\Delta V_1$ and $\Delta V_2$ are represented by the vertical leading edges of the rectangular waveforms shown respectively in full and dashed lines in FIG. 2(*b*). The positive voltage pulse $\Delta V_2$ appears at the junction 19 between resistor R5 and transformer secondary 2. This junction 19 was maintained at a potential substantially equal to the voltage $V_{18}$ at capacitor terminal 18 and the transistor base voltage $V_b$ throughout the relaxation period. In view of the steep transitional nature of the voltage pulse $\Delta V_2$, the capacitors C6 and C16 act as virtual shortcircuits in respect to it, and hence a closed circuit loop can be traced from junction 19 through resistor R5, the base-emitter junction of conductive transistor T4, capacitor C16 to ground and then from ground through capacitor C6 and transformer winding 2 back to junction 19.

A current designated as $I_{R5}$ therefore flows through resistor R5. As will appear presently, the diode D11 is rendered conductive substantially simultaneously with transistor T4 by application of a negative voltage from the collector terminal through coupling capacitor C17 to resistor junction 21. Hence the current $I_{R5}$ appearing through resistor R5 as just described, divides between two circuit branches in parallel, the one being through the base-emitter junction of transistor T4 and capacitor C16 to ground, and the other being through diode D11 and resistors R12 and R13 to ground. The current through the first, transistor, path is designated $I_b$ and serves to apply an additional positive bias to the transistor base, thereby rapidly bringing the transistor to saturation so that the transistor will retain a state of maximum, constant conductivity by a cumulative or snowball effect throughout the regeneration phase of the circuit.

The current flowing through the second parallel path, that through diode D11, is designated $I_D$. This current, according to an important feature of the invention, retains an approximately constant value throughout the regeneration phase (period $t_2$), as will be shown presently.

Throughout the regeneration period $t_2$, the voltage difference across winding 1 is maintained at the constant value $\Delta V_1$ by continuous supply of current from voltage source $V_a$ through resistor R15 and the conductive transistor T4. Hence also, the induced voltage difference across secondary winding 2 is likewise maintained constant at the positive value $\Delta V_2$, as shown in FIG. 2(*b*). Due to this persisting voltage drop $\Delta V_2$ which holds the terminal 18 at a more negative voltage than terminal 19, there is a persistent flow of current $I_{R5}$ from terminal 18 through winding 2 and resistor R5, which charges the terminal 18 and hence the upper side of capacitor C6 to a negative potential. The increase in negative capacitor charge during the regeneration period (time $t_2$) of the cycle, is indicated as the inverse exponential curve during the $t_2$ period in FIG. 2(*a*). As the negative charge at capacitor terminal 18 increases, the charging current $I_{R5}$ decreases.

Since $I_{R5}=I_b+I_D$ as earlier noted, and since the term $I_D$ is substantially constant also as noted, it is evident that the decrease of the charging current $I_{R5}$ causes a corresponding decrease in the current $I_b$ applied to the base of transistor T4. The base potential therefore drops, and falls below the saturation threshold. When this occurs the conductivity of the transistor starts decreasing and rapidly brings the transistor to its cut-off or blocking condition through a cumulative or snowball effect. This is because a small drop of the transistor conductivity below the constant saturation value produces a corresponding drop in the voltage difference $\Delta V_1$, and hence also in the voltage difference $\Delta V_2$ which in turn reduces the current $I_{R5}$ and hence the current $I_b$ applied to the transistor base, thus amplifying the initial effect. The transistor is thus turned off and a fresh relaxation period of the operating cycle of the system sets in.

An essential feature in the operating process just described is that the current, here inabove called $I_D$, flowing through the circuit path D11–R12–R13 should reach a prescribed, high, value at the start of the regeneration period $t_2$ and maintain that value throughout that period, as mentioned above. This junction of the improved system is accomplished as follows.

As soon as transistor T4 reaches its saturated condition at the start of the regeneration period, negative voltage pulse $\Delta V_1$ appears at the collector terminal of the transistor as earlier described, and this voltage pulse is applied through coupling capacitor C17 to the junction 21, developing, the corresponding negative pulse $\Delta V_{21}$ at that junction. Junction 21, therefore, is maintained at a constant negative potential throughout the regeneration period. Current therefore flows from the transistor base through diode D11 and resistor R12 to junction 21, and, since both the base potential of the saturated transistor, and the potential at junction 21, are constant over that period, the said current $I_D$ also is constant.

The values of resistors R12, R13 and R14 are so selected that in the absence of the negative voltage pulse $\Delta V_1$ at junction 21, that is, during the relaxation period of the cycle, the potential at diode terminal 20 is at all time sufficiently high relative to the transistor base potential $V_b$ as to prevent conduction of diode D11 as earlier indicated, whereas in the presence of the negative pulse $\Delta V_1$ at junction 21, i.e. in the regeneration period, the potentials at terminals 20 and 21 are so related to the transistor base potential that the diode conducts as just indicated above, and that the resulting constant diode current $I_D$ is several times, e.g. five or six times, greater than the maximum transistor base current $I_b$ required to keep the transistor T4 in saturated condition. Exemplary values for the resistors and other circuit components will be given later.

The time periods $t_1$ and $t_2$ that characterize the oscillator cycle will now be derived mathematically, and it will then be shown that in accordance with a basic advantageous feature of the invention, these periods are substantially independent of the characteristics of the transistor.

The relaxation period $t_1$ will first be derived. Referring to FIG. 2 and using the notations earlier defined with reference to that figure, the equation of the capacitor $C_6$ discharge curve over the relaxation period can be written as follows:

$$V_{18}=V_M \exp\left(-\frac{t}{(R_7+R_8)C_6}\right)$$

The expression for $t_1$ is then obtained by writing that at the time period $t_1$ the above expression equals the transistor conduction threshold voltage $V_b=V_e+V_{be}$, and taking the natural logarithm of the expression. We get:

$$t_1=(R_7+R_8)C_6 \log_e\left(\frac{V_M}{V_e+V_{be}}\right) \quad (1)$$

The regeneration period $t_2$ is similarly derived by writing the charge curve equation for capacitor C6 with the charging current $I_{R5}$ through resistor $R_5$:

$$R_5 I_{R5}=\Delta V_2 \exp\left(-\frac{t}{R_5C_6}\right)$$

and then writing that at the end of the regeneration period $t_2$ the charging current $I_{R5}$ equals $I_{R5(min)}=I_D+I_{b(min)}$ where $I_{b(min)}$ is the transistor threshold saturation current, a characteristic of the transistor used. Taking the natural logarithm, we get:

$$t_2R_5C_6 \log_e \frac{\Delta V_2}{R_5(I_D+I_{b(min.)})} \quad (2)$$

In the Equation 1 for $t_1$, it will be seen that provided $$|V_M|-|V_e|\gg|V_{be}| \quad (3)$$

the relaxation period $t_1$ will be practically independent of the characteristics of the transistor $T_4$ used. Further, the period $t_1$ does not depend on the turns ratio of the transformer TR.

Turning to Equation 2, this shows that value $t_2$ also will be unaffected by the transistor characteristics, or the transformer turns ratio, provided $$I_D\gg I_{b(min)} \quad (4)$$

Thus it will be seen that by maintaining through the auxiliary circuit branch including diode D11 and resistors R12 and R13 a substantially constant current throughout the regeneration period of the oscillator, which is substantially higher, say five or six times higher, than the transistor base current $I_{b(min)}$ required to hold transistor T4 in its saturated condition the invention achieves the important advantage of rendering the characteristic output time parameters $t_1$ and $t_2$ of the oscillator circuit substantially unaffected by variations in the transistor characteristics. Also, since said time periods are independent of the output transformer turns ratio, the additional advantage can be obtained that said time parameters $t_1$ and $t_2$ are unaffected by variations in the load, provided the supply voltage $V_a$ is suitably adjusted, as will now be shown.

FIG. 3(*a*) illustrates part of the improved oscillator circuit of FIG. 1, wherein the output circuit is shown replaced by an equivalent circuit including a load resistor $R_{22}$ directly connected across the transformer primary winding 1. It will be apparent that the relation between resistance $R_{22}$ and the load resistance $R_{10}$ shown in FIG. 1 is $$R_{22}=R_{10}(n_1/n_3)^2$$

where $n_1$ and $n_3$ are the numbers of turns in the transformer windings 1 and 3.

Putting L=inductance of transformer winding 1, $I_L$ the current therethrough, and $I_{R22}$ the current through resistor $R_{22}$, then during the regeneration period $t_2$ the collector current in transistor $T_4$ is $I_c=I_L+I_{R22}$. In this equation, the current $I_L$ is approximately $I_L=V_o/R_{22}$, where $V_o$ is the collector voltage during the relaxation period.

The value of collector voltage $V_o$ can be derived from the graph of FIG. 3(*b*) which illustrates the variations of the collector voltage over the entire oscillator cycle. Since the cross hatched areas above and below the zero axis are substantially equal as between the relaxation periods $t_1$ and regeneration periods $t_2$ over the oscillator cycle, it is clear that $$V_o=V_e(t_2/t_1)$$

It follows that $$I_c=\frac{V_e}{R_{22}}\left(1+\frac{t_2}{t_1}\right) \quad (5)$$

Hence, the average current $\bar{I}_c$ flowing through transistor $T_4$ is $$\bar{I}_c=\frac{V_e}{R_{22}}\left(1+\frac{t_2}{t_1}\right)\left(\frac{t_2}{t_1+t_2}\right)=\frac{V_e}{R_{22}}\left(\frac{t_2}{t_1}\right) \quad (6)$$

Referring to FIG. 3(*a*), it will be seen that the average current $I_c$, whic his constant over each of the periods $t_1$ and $t_2$, is the same as the current flowing through resistor $R_{15}$ in the corresponding period, since decoupling capacitor $C_{16}$ isolates this current from ground. It is therefore evident that $$V_e=V_a-R_{15}\bar{I}_c$$

and it follows from the above Equations (6) and (7) that $$\frac{t_2}{t_1}=\frac{R_{22}}{R_{15}}\left(\frac{V_a}{V_e}-1\right) \quad (8)$$

this last equation shows that in the event of a variation in the equivalent load resistance $R_{22}$, as in the case of a different load being connected to the oscillator output, it is simply necessary to readjust the supply voltage $V_a$ in order to retain the ratio $t_2/t_1$ of the oscillator output periods constant at a prescribed value, if this is desired.

As shown in FIG. 1, the terminal end of resistance line $R_8$–$R_7$ can be connected to a control voltage $V_{AS}$ instead of being connected to ground as so far considered in the description. This generally conventional arrangement provides a means of varying the time periods $t_1$ and $t_2$ and the output frequency of the oscillator, through alteration of the charge and discharge periods of capacitor $C_6$.

In a preferred embodiment of the invention, the blocking oscillator circuit described is used as a switching stage for a television sweep generator system, as will now be disclosed with reference to FIG. 4.

FIG. 4 illustrates a horizontal (line) sweep generator system for a television system, which includes a blocking oscillator circuit similar to the one shown in FIG. 1 except that the resistor designated $R_8$ in that figure is here replaced with a pair of parallel resistors $R'_8$ and $R''_8$. A "standard" selector switch ST is provided for selectively connecting either resistor $R'_8$ or $R''_8$ in circuit between adjustable resistor $R_7$ and control voltage terminal $V_{as}$ and thereby to select between two different TV line standards. In this embodiment, with switch ST in its upper position and $R'_8$ in circuit, the system is conditioned for use with the 819 line standard, while with switch ST thrown to its lower position and $R_{82}$ in circuit, the system is conditioned for the 625 line standard, as will be made clearer later. The control or reference voltage terminal $V_{as}$ may be connected, by way of an amplifier stage, to the output of a phase comparator (not shown) having one input connected to receive the sweep signal from the sweep generator of the invention and its other input connected to receive a phase reference signal at the standard line sweep rate.

Connected to the output winding 3 of coupling transformer TR is a sweep circuit which replaces the load schematically represented as a resistance $R_{10}$ in FIG. 1. The sweep circuit comprises a sweep transistor $T_{23}$ having its base connected to one end of transformer output winding 3, the other end of which is grounded, and its collector connected to the horizontal deflection coil 24 of the TV system. The collector of $T_{23}$ is further connected to the parallel combination of a capacitor $C_{25}$ and a diode $D_{26}$ the other end of which is grounded together with the emitter of transistor $T_{23}$. This parallel network branch provides a path for the recovery of energy reactively stored in the deflection coil 24, during the non-conductive period of the transistor.

In the operation of this line sweep circuit, the blocking oscillator section of the circuit produces an output of the type earlier described with reference to FIGS. 1 and 2. The relaxation time period earlier designated $t_1$ is selectable between two different values depending on the position of the standard selector switch ST. The oscillator output is applied to the base of sweep transistor $T_{23}$. This latter is therefore switched between its saturated conductive and non-conductive states in generally complementary time relationship with the corresponding states of the switching transistor $T_4$ of the blocking oscillator section. In other words, sweep transistor $T_{23}$ is cut off during the regeneration period $t_2$ and turned on or saturated during the relaxation period $t_1$, and energizes the deflection coil 24 accordingly so as to deflect the electron beam of a TV tube (not shown) horizontally across the screen at prescribed rate.

It is of considerable importance for the proper operation of the sweep circuit that the sweep transistor $T_{23}$ should be supplied with a constant base current during the saturated period thereof, i.e. the period $t_1$, irrespectively of any variations in the duration of said period. When using the improved blocking oscillator of FIG. 1 as the means for switching the sweep transistor $T_{23}$, variations in $t_1$ due to inadvertent causes such as temperature and drift are minimized as earlier indicated and this is one important advantage of the sweep circuit of FIG. 4. However, there are additional causes of variation in the time period $t_1$, and primarily the deliberate alteration of said period through actuation of standard selector switch ST as described above. Normally such action would result in substantial and objectionable variations in the base current of transistor $T_{23}$ during the saturation period thereof, liable to destroy the transistor or seriously impair its service life. This difficulty is eliminated in the system of FIG. 4, in the following manner.

It can be shown by analysis that when the turns ratio of the transformer winding 1 and 3, designated $$(n_1/n_3)=n$$

is selected to satisfy the relation $$n=\frac{Ve}{V_{be23}}\times\frac{t_2}{2t_1+t_2} \quad (9)$$

where $V_{bd23}$ represents the base-emitter voltage of sweep transistor $T_{23}$ (a characteristic of the transistor) and the other symbols have the meanings earlier defined, then the derivative of the base current $I_{b23}$ of said sweep transistor, with respect to the time period $t_1$ considered as a variable, is zero. This property is a direct consequence of the feature of the invention, earlier described with reference to FIG. 1, that the emitter of switching transistor $T_4$ is automatically held at a constant bias potential $V_e$ by way of resistor $R_{15}$ and associated decoupling capacitor $C_{16}$ from the supply voltage terminal $V_a$.

Let it be assumed that the sweep generator circuit of the invention is to be operated over a range of different values for $t_1$ from a value $t_1'$ to a value $t_1''$. If in the above Equation 9 $t_1$ is replaced with the arithmetic mean $$\frac{1}{2}(t+_1t_1'')$$

the equation becomes $$n=\frac{V_e}{V_{be22}}\times\frac{t_2}{t_1'+t_1''+t_2} \quad (10)$$

Thus, if the turn ratio $n=n_1/n_3$ of the coupling transformer TR is selected so as to satisfy this relation (10), the base current $I_{b23}$ of the sweep transistor $T_{23}$ will remain practically unchanged for all values of $t_1$ over the range ($t_1'$, $t_1''$), and the sweep circuit will therefore operate under optimal conditions over this range. Otherwise stated, the curve representing the variations of base current $I_{b23}$ as a function of $t_1$ presents a very flat hump, or is practically a horizontal line, between the values $t_1=t_1'$ and $t_1=t_1''$. In particular, if $t_1'$ and $t_1''$ are selected to correspond with the desired horizontal sweep periods prescribed for the 819 line standard and the 625 line standard respectively (it being noted that the beam fly-back period and hence the requisite regeneration period $t_2$ is the same for both standards), then actuation of standard selector switch ST to either of its positions will leave the sweep transistor base current $I_{b23}$ practically unaltered, and the sweep transistor will operate under conditions of optimal efficiency and reliability for both standards.

It is emphasized that the feature of the invention just described, while here disclosed with reference to its use in selecting between different television standards, actually is of broader utility in that it will eliminate variations in the sweep transistor base current when the oscillator output characteristics are varied irrespective of the cause and precise nature of such variations.

In a practical embodiment of the line sweep circuit of FIG. 4, the circuit elements have the values and type characteristics indicated in the figure. In the upper position of switch ST, in which the 819-line television standard is selected, resistor $R_8'=1500$ ohms is in circuit, while in the lower switch position, for selecting the 625-line standard, resistor $R_8''=2400$ is in circuit.

Applying Equation 1, we obtain the following values for the relaxation time periods $t_1'$ and $t_1''$ specified for the respective line standards, with adjustable resistor $R_7$ set in its intermediate, 500 ohm, position:

$$t_1'=37\ \mu\text{s., and } t_1''=52\ \mu\text{s.}$$

In either case, the regeneration period $t_2$ is found from Equation 2 to be $$t_2=12\ \mu\text{s.}$$

Referring to Inequality 3, it can be verified that the left hand member equals 3 volts and the right member is 0.4 volt so that the inequality is amply satisfied. In Inequality 4, $I_D$ is about 4.5 ma. and $I_{b(min)}$ about 0.8 ma., so that this condition also is satisfied.

Equation 10 indicates that with the above indicated values (noting that $V_{be23}=V_{be}=0.4$ volt), the optimal turns ratio $n=n_1/n_3$ required to assure a constant base current on transistor $T_{23}$ for both selectable values $t_1'$ and $t_1''$ of the $T_4$ relaxation period (and for intermediate values thereof) is about 4.8. With the numbers of turns used, as indicated adjacent to the transformer windings in FIG. 4, the ratio $n=5$, which is sufficiently close to the optimal value for practical purposes.

Tests have confirmed that in the resulting circuit the time parameters $t_1$ and $t_2$ and hence the line sweep characteristics are very largely independent of any variations in the characteristics of the transistors used, as may be due to manufacturing tolerances, temperature, aging and other drift factors. The current applied to the base of the sweep transistor throughout the saturation period thereof is found to retain a substantially constant value of from 240 ma. to 200 ma. in either position of the standard selector switch. Also the circuit can easily and quickly be adjusted and readjusted to alter or restore desired values of the time parameters, as in the case of alteration in the output load connected to the circuit. Further, the current values flowing through the various branches of the circuit, including the currents designated $I_D$, $I_{R5}$ and $I_c$ above, are well-defined and limited as indicated by the equations and as confirmed by measurement.

In the exemplary embodiment here disclosed, the invention is shown applied to a blocking oscillator of the type in which the feedback loop by way of the coupling transformer is connected from the collector to the base of the transistor. It is to be understood that the teachings of the invention are also applicable to other patterns of the feedback connection, including collector-emitter feedback loops. The invention however is of especial value in the illustrated instance of collector to base (or the equivalent emitter to base) feedback loop, for the following reason. This particular feedback pattern is especially desirable in a blocking oscillator because it requires substantially less feedback power and lower average transistor base current, and allows of readier frequency control, than other feedback arrangements. At the same time, the arrangement referred to has heretofore displayed in operation a very marked dependency of the output frequency and time parameters of the blocking oscillator, on the characteristic gain (static current gain $\beta$) of the transistor, and on the load. For these reasons the oscillator output time factors have depended to a substantial degree on the characteristics of the particular transistor used. It is well-known in the art that present technology does not easily and reliably permit of series producing transistors having precisely predetermined, uniform characteristics. Further, such characteristics are affected by temperature variations and aging. As a result, there is a substantial spread or uncertainty in the output time parameters of conventional blocking oscillators of the type referred to. The invention, in one aspect, can be said to provide a transistor which, in effect, is free from gain spread, through the provision of an auxiliary path of current flow so arranged that, during the regeneration period $t_2$ and only during that period, a high and constant current is tapped from the control electrode (usually the base as here shown) of the transistor, which will be several times (e.g. five or six) times higher than the base current required to maintain the transistor in its saturated state. The resulting transistor circuit can be thought of as simulating a type of transistor requiring a higher base current than does the transistor actually used, but which simulated transistor will be virtually free from gain spread. While the apparent current gain of the transistor is thereby reduced somewhat, this disadvantage is amply offset by the stability thus achieved in the output factors of the oscillator circuit. Jointly with this important feature, the invention achieves the additional and equally important result of automatically biasing the third electrode (herein the emitter) of the transistor, by way of an automatic biassing network including in this embodiment resistor $R_{15}$ and capacitor $C_{16}$, in such a manner that the output turns factor ($n$) of the coupling transformer can be selected at an optimal value ensuring that the output current, as applied to the control electrode of a load transistor ($T_{23}$), will be substantially independent of the form factor of the oscillator output pulses. This result is of special value in cases where said load transistor is a "sweep" transistor in a television sweep circuit as here disclosed.

In addition to the advantages earlier described, it will be realized that the sweep circuit shown in FIG. 4 is greatly simplified as compared to conventional sweep circuits of generally similar type, in that the isolating and amplifying stage or stages that have been usually required to be interposed between the switching, blocking-oscillator circuit section of the system, and the output or load section including the sweep transistor, are here dispensed with.

What I claim is:

1. A blocking oscillator circuit comprising:
- a transistor (T4) having a base, an emitter and a collector electrode, one of said electrodes being a control electrode and another of said electrodes being an output electrode;
- chargeable capacitance means (C6);
- discharge resistance means (R7, R8) connected to said capacitance means for discharge of the latter therethrough;
- charging resistance means (R5) connected to said capacitance means and said control electrode for charging said capacitance means therethrough by way of said transistor;
- inductive means (1, 2) coupling said output electrode and control electrode of the transistor (T4) to provide an oscillation-sustaining feedback loop for said oscillator circuit;
- voltage means ($V_a$) connected to said transistor electrodes;
- whereby said oscillator circuit will alternate between a relaxation phase wherein said transistor (T4) is blocked and said capacitance means (C6) discharges through said discharge resistance means (R7, R8), and a regeneration phase wherein said transistor is saturated and said capacitance means (C6) is charged through said charge resistance means (R5) and said transistor;
- an auxiliary circuit branch connected to said control electrode and including unidirectional conducting means (D11); and
- further capacitance means (C17) connected to said output electrode and said auxiliary circuit branch for biassing said unidirectional conducting means (D11) for conduction during said regeneration phase only, whereby to derive during said phase a substantially constant current through said auxiliary circuit path substantially larger than the current required to hold said transistor (T4) in said saturated state.

2. The circuit defined in claim 1, wherein said control electrode is the base of the transistor (T4).

3. The circuit defined in claim 1, wherein said inductive coupling means (1, 2) form part of an inductive coupling device (TR) which further serves to derive an output signal from the circuit.

4. The circuit defined in claim 1, wherein said auxiliary circuit branch comprises resistance (R12, R13) connected in series with said unidirectional conducting means (D11), said further capacitance means (C17) is connected to a point (21) of said last-mentioned resistance (R12, R13), and comprising further resistance (R14) connected to said point (21) and to said voltage means ($V_a$).

5. The circuit defined in claim 1, including additional resistance (R15) connected to said voltage means ($V_a$) and to the remaining electrode (e.g. emitter) of said transistor (T4), and a decoupling capacitor (C16) connected to said remaining electrode.

6. A circuit comprising:
- a blocking oscillator section including:
  - a first transistor (T4) having a base, an emitter and a collector electrode, one of said electrodes being a control electrode and another being an output electrode;
  - chargeable capacitance means (C6);
  - discharge resistance means (R7, R8) connected to said capacitance means (C6) for discharge of the latter therethrough;
  - charging resistance means (R5) connected to said capacitance means and said control electrode for charging said capacitance means therethrough by way of said first transistor (T4);
  - inductive means (1, 2) coupling said output electrode and control electrode of the first transistor (T4) to provide an oscillation-sustaining feedback loop for said oscillator circuit;
  - voltage means ($V_a$) connected to said first transistor (T4);
  - whereby said oscillator circuit will alternate between a relaxation phase wherein said first transistor (T4) is blocked and said capacitance means (C6) discharges through said discharge resistance means (R7, R8) and a regeneration phase wherein said first transistor is saturated and said capacitance means (C6) is charged through said charge resistance means (R5) and said first transistor;
  - an auxiliary circuit branch connected to said first transistor control electrode including means (D11, C17, R12, R13) for deriving a substantially constant current through said auxiliary path during said regeneration phase; and
  - further inductive means (1, 3) coupling said output electrode of the first transistor (T4) to an output; and
- a load section connected to said output of the blocking oscillator section and including:
  - a further transistor (T23) having a base, an emitter and a collector electrode one of said electrodes being a control electrode and another an output electrode;
  - means connecting said control electrode of the further transistor (T23) to said blocking oscillator section output;
  - whereby said further transistor (T23) will be blocked during the regeneration phase of said first transistor (T4) and saturated during the relaxation phase thereof;
- and means (R15, C16) connected to the remaining electrode of said first transistor (T4) for biassing said remaining electrode to a predetermined constant potential during said relaxation phase of the first transistor (T4) whereby to apply a substantially constant current to the control electrode of the further transistor (T23) during the saturated state of said latter, regardless of variations in timing of said phases of the first transistor (T4).

7. The circuit defined in claim 6, wherein said base of the further transistor (T23) constitutes said control electrode thereof.

8. The circuit defined in claim 6, including capacitor and diode means (C25, D26) connected in parallel across said output electrode and the remaining electrode of said further transistor (T23).

9. The circuit defined in claim 6, wherein said further inductive coupling means (1, 3) has a turns ratio predetermined for maintaining said current applied to the further transistor control electrode substantially constant for prescribed, different values of said timing of the phases of the first transistor (T4).

10. The circuit defined in claim 6, comprising selectively switchable resistance means ($R_8'$, $R_8''$, ST) connected to said chargeable capacitance means (C6) for selecting between said prescribed timing values.

11. The circuit defined in claim 6, wherein said means for biassing the remaining electrode of the first transistor (T4) comprises additional resistance (R15) connected to said voltage means ($V_a$) and to said remaining electrode of the first transistor, and a decoupling capacitor (C16) connected to said remaining electrode.

12. The circuit defined in claim 11, wherein said auxiliary circuit branch comprises unidirectional conducting means (D11), resistance (R12, R13) connected in series with said unidirectional means, further capacitance (C17) connected to a junction (21) of said last-mentioned resistance and to said output electrode of the first transistor (T4).

13. The circuit defined in claim 6, including a television deflection coil (24) connected to said output electrode of the further transistor (T23).

References Cited

UNITED STATES PATENTS 3,302,033 1/1967 Goodrich -------- 331—112 X

ROY LAKE, *Primary Examiner.*

SIEGFRIED H. GRIMM, *Assistant Examiner.*

U.S. Cl. X.R.

331—75, 150, 175; 178—69.5; 315—29